(12) United States Patent
Scott et al.

(10) Patent No.: US 8,784,130 B2
(45) Date of Patent: Jul. 22, 2014

(54) SUPPLY SIDE BACKFEED METER SOCKET ADAPTER

(71) Applicant: SolarCity Corporation, San Mateo, CA (US)

(72) Inventors: Damien Scott, Daly City, CA (US); Ben Tarbell, Palo Alto, CA (US); Julian Ryba-White, San Francisco, CA (US); Peter Rive, San Francisco, CA (US); Eric Carlson, San Mateo, CA (US)

(73) Assignee: Solarcity Corporation, San Mateo, CA (US)

( * ) Notice: Subject to any disclaimer, the term of this patent is extended or adjusted under 35 U.S.C. 154(b) by 22 days.

(21) Appl. No.: 13/670,335

(22) Filed: Nov. 6, 2012

(65) Prior Publication Data

US 2014/0127935 A1    May 8, 2014

(51) Int. Cl.
*H01R 33/945* (2006.01)

(52) U.S. Cl.
USPC .......................................... 439/517; 439/640

(58) Field of Classification Search
CPC ........... H01R 23/7073; H01R 13/5202; H01R 13/64; H01R 13/71; H01R 23/025; H01R 13/7042; H01R 13/6215
USPC .................. 439/660, 517, 146, 640
See application file for complete search history.

(56) References Cited

U.S. PATENT DOCUMENTS

| 6,074,246 | A * | 6/2000 | Seefeldt et al. | 439/517 |
| 6,545,374 | B1 * | 4/2003 | Allenbach | 307/125 |
| 7,121,899 | B2 * | 10/2006 | Homann et al. | 439/680 |
| 7,322,850 | B2 * | 1/2008 | Neer et al. | 439/567 |
| 7,420,801 | B2 * | 9/2008 | Behl | 361/679.33 |
| 7,648,389 | B1 * | 1/2010 | Scott et al. | 439/517 |
| 7,914,347 | B2 * | 3/2011 | Paulus | 439/680 |
| 8,419,291 | B2 * | 4/2013 | Koreeda et al. | 385/56 |
| 2006/0099841 | A1 * | 5/2006 | Coyle, Jr. et al. | 439/248 |
| 2011/0104932 | A1 * | 5/2011 | Koellmann | 439/374 |
| 2013/0027856 | A1 * | 1/2013 | Tai et al. | 361/679.01 |
| 2013/0102174 | A1 * | 4/2013 | Brown et al. | 439/218 |
| 2013/0218100 | A1 * | 8/2013 | Armbruster et al. | 604/264 |

* cited by examiner

*Primary Examiner* — Neil Abrams
*Assistant Examiner* — Phuongchi T Nguyen
(74) *Attorney, Agent, or Firm* — Fountainhead Law Group, PC

(57) ABSTRACT

The present invention includes a back feed meter adapter having one or more electrical sockets disposed of the exterior surface for accepting a plug from an alternative electrical power generator in installations that include an existing electrical utility service panel. The sockets of the back feed meter can be rotated relative to the internal couplers such that it can be easily positioned relative to the back feed connections coming from the alternative electrical power generator. The back feed meter adapter can also include an electrical switch for coupling/decoupling the electrical sockets from the electrical meter, the electrical service panel, or the electrical power utility grid to which the back feed meter adapter is coupled. The back feed meter adapter can include a window for visual confirmation of the electrical switch state. Various functionality of the back feed meter adapter can be monitored or controlled via a wireless network.

19 Claims, 15 Drawing Sheets

SUPPLY SIDE BACKFEED METER SOCKET ADAPTER

CROSS REFERENCE TO RELATED APPLICATIONS

This Application is related to U.S. patent application Ser. No. 12/166,205 filed Jul. 1, 2008 entitled, "Supply Side Backfeed Meter Socket Adapter," issued as U.S. Pat. No. 7,648,389 on Jan. 19, 2010, which is incorporated herein by reference in its entirety for all purposes.

BACKGROUND

The present invention relates to distributed electrical power generation and storage, and in particular, to systems, methods, and apparatuses for connecting renewable electrical power generators and/or storage systems and/or Electric Vehicle Charging systems to new and existing conventional electrical power distribution panels, service panels, meters, and meters sockets.

Unless otherwise indicated herein, the approaches described in this section are not prior art to the claims in this application and are not admitted to be prior art by inclusion in this section.

Conventional electrical power service coming in from a conventional electrical grid-based utility service is typically delivered on three wires, two hot and one neutral. These three wires are typically first connected to an electrical meter used by utility companies or commissions that generate and/or distribute electrical power to measure the amount of electrical power consumed by a particular building or other point of use. The consumption end of the electrical power grid is often referred to as the supply side of the distribution system. Conventional supply side electrical meters often include an enveloped instrument, often encased in a glass or other transparent plastic material, with an analog or digital meter that measures the rate at which the building is consuming electrical power. Such electrical meters can be read locally or can be equipped to send production and consumption data back to a central monitoring station via a wired or wireless network. Many of such electrical power meters register various electrical power usage characteristics, such as net total power consumption, which is often measure in in kilo-watt hours (kWh).

Conventionally, the electrical meter is connected to a distribution or service panel with many branch circuit breakers using main disconnect tandem circuit breaker. Sometimes there are spare, unused locations in the distribution panel at which new branch circuits can be added. While it is possible to connect a back feed power supply, i.e. a power supply that stores or generates at the supply side location, to the one of the spare or unused circuits to send electrical power back into the electrical power distribution grid or provide electrical power to be used locally by one or more devices connected to one or more of the other branch circuits, more often than not, there is no room in the distribution panel for more circuits.

Even if there is room for an additional back feed circuit in the distribution panel, the back feed from the local power store, generator or Electric Vehicle charging system can often be larger than code would allow for the given distribution panel rating or size. In particular, most supply side distribution panels do not include circuits with the rating or capability needed to support a utility back feed from a substantial local electrical power generator, such as residential or commercial scale photovoltaic, wind turbine, or hybrid electric power generation installations, and energy storage system like batteries, or an electric vehicle charging system. Additionally, connecting such power systems to a typical distribution panel can trigger a whole host of problems regarding service capacity which can lead to problems with code inspections or require major rewiring.

What is needed is a device for connecting supply side electrical power generators, such as solar, wind, and fuel cell electrical power systems, batteries, or electric vehicle charging systems, to a utility power panel between the main disconnect and the meter, without causing or needing any modifications to the pre-existing main power disconnects or power distribution panels.

Thus, there is a need for improved supply side back feed power meter adapter. The present invention solves these and other problems by providing an improved supply side back feed power meter adapter.

SUMMARY

Embodiments of the present invention improve systems, devices, and methods for connecting alternative electrical power generators to existing electric service panels and utility meters. In one embodiment, the present invention includes a supply side back feed meter socket adapter that can include a body having an interior surface and an exterior surface and dimensioned to couple to an existing utility power meter, a first set of electrical couplers disposed on a first end of the body and configured to connect to electrical couplers in the existing utility power meter, a second set of electrical couplers disposed on a second end of the body and configured to connect to electrical couplers of an electrical service panel, and a first electrical socket disposed on the exterior surface of the body and comprising a plurality of receptacles, wherein the receptacles are coupled to the first or second set of couplers.

In related embodiments, the exterior surface of the body is rotatably coupled to the first and second set of couplers, such that the first electrical socket can be angularly rotated relative to the first and second set of couplers.

In other embodiments, the body comprises an internal body and an external body, wherein the internal body is disposed inside and shares a common axis with the external body. The external body can be electrically and rotatably coupled to the internal body. The internal body can include a plurality of circumferential slots configured to accept a plurality of conductors from the external body such that the conductors can move in the slots when the external body is rotated relative the internal body.

In some embodiments the adapter can include a back feed connection from an alternative electrical power generator having prongs corresponding to the plurality of receptacles coupled to the first electrical socket.

In another embodiment, the adapter can include an electrical switch disposed in the body and coupled between the receptacles of the electrical socket and the first or second set of couplers, wherein the electrical switch is operable to decouple the receptacles from the first or second set of couplers. In such embodiments, the body can include a window disposed in proximity of the electrical switch, and wherein the electrical switch comprises a plurality of mechanical switches visible through the window.

In yet other embodiments, the adapter can include a second electrical socket disposed on the exterior surface of the body at an angular separation from the first electrical socket and comprising a second plurality of receptacles, wherein the second plurality of receptacles are coupled to the first or second set of couplers.

In one embodiment, the receptacles can be coupled to the first or second set of couplers via the electrical switch, wherein the electrical switch is operable to decouple the second plurality of receptacles from the first or second set of couplers.

In one embodiment the adapter can include a status indicator disposed on the exterior surface of the configured to indicate a back feed status of an alternative electrical power generator coupled to the first electrical socket.

In one embodiment, the adapter can also include a wireless network adaptor configured to relay status or control signals.

Another embodiment of the present invention is directed toward a method for installing a supply side back feed in a preexisting electrical service panel. The method can include inserting an adapter between an electrical utility power meter and service distribution panel. In such embodiments, the adapter can include a body having an interior surface and an exterior surface and dimensioned to couple to an existing utility power meter, a first set of electrical couplers disposed on a first end of the body and configured to connect to electrical couplers in the existing utility power meter, a second set of electrical couplers disposed on a second end of the body and configured to connect to electrical couplers of an electrical service panel, and an electrical socket disposed on the exterior surface of the body and comprising a plurality of receptacles, wherein the receptacles are coupled to the first or second set of couplers.

In related embodiments, the method can also include rotating the electrical socket relative to the first and second set of couplers to position the first electrical socket relative to a back feed connection from an alternative electrical power generator. Such embodiments can include inserting prongs from the back feed connection into the receptacles of the first electrical socket.

In one embodiment the method can also include activating a switch coupled between the electrical socket and the first or second set of couplers. In such embodiments, activating the switch can include sending a signal to a wireless network adapter coupled to the switch or manually operating an activation mechanism on the exterior surface of the body coupled to the switch.

In one embodiment the method can also include visually confirming activation of the switch through a window disposed in the body.

Another embodiment of the present invention is directed toward a method for servicing an alternative electrical power generator system that includes a body having an interior surface and an exterior surface and dimensioned to couple to an existing utility power meter, a first set of electrical couplers disposed on a first end of the body and configured to connect to electrical couplers in the existing utility power meter, a second set of electrical couplers disposed on a second end of the body and configured to connect to electrical couplers of an electrical service panel, and an electrical socket disposed on the exterior surface of the body and comprising a plurality of receptacles, wherein the receptacles are coupled to the first or second set of couplers via an electrical switch, the method comprising. The method can include deactivating the electrical switch and visually confirming deactivation of the electrical switch through a window disposed in the body. Deactivating the electrical switch can include manually operating a deactivation control disposed on the body or sending a deactivation control signal to the electrical switch via a wireless network connection The following detailed description and accompanying drawings provide a better understanding of the nature and advantages of the present invention.

DETAILED DESCRIPTION

Described herein are techniques for a supply side back feed adapter. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
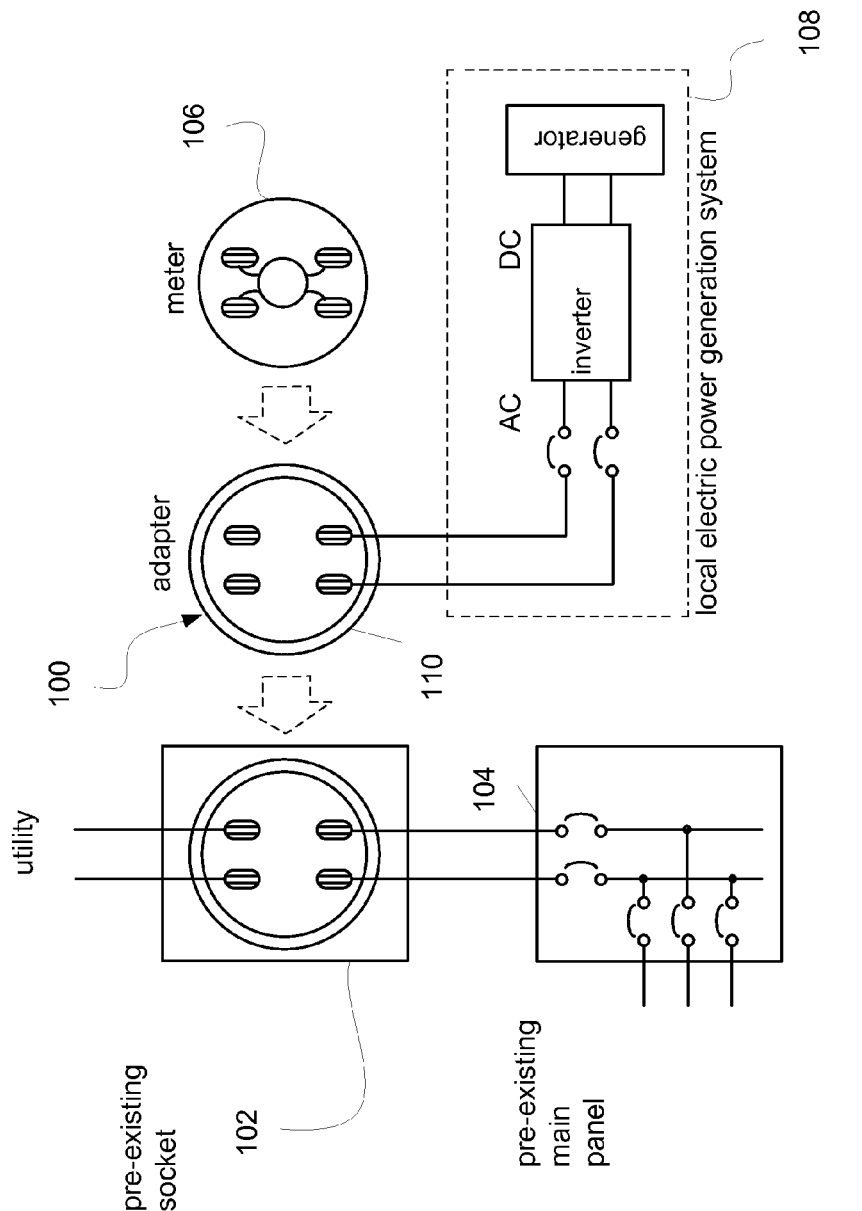
FIG. 1 is a simplified schematic of a back feed adapter system according to one embodiment.

FIG. 1 represents an adapter system embodiment of the present invention, and is referred to herein by the general reference numeral 100. The adapter system 100 makes use of a pre-existing and conventional meter socket 102 and main distribution panel 104 that can be mounted flush inside or on a wall. A utility power meter 106 measures and registers power usage for a power utility billing purposes. A local electric power generation (or battery or EV charger) 108, such as a solar photovoltaic or wind turbine system, and associated electrical equipment panels with an inverter, can be added and mounted on or in a location, such as wall, near the meter socket 102 and main distribution panel 104. One advantage of system 100 is that it can be installed without altering or otherwise disturbing pre-existing meter sockets 102 and main distribution panels 104. Installing meter socket adapters according to various embodiments of the present disclosure can also avoid the need to upgrade or replace existing meters and distribution panels when installing alternative electrical power generation system 108 with back feed power capabilities that feed surplus or otherwise unused electrical power back into the utility electrical power distribution grid.

Various embodiments include an adapter 110 to provide a connection to the AC output of the alternative electric power generation system 108 to the load side of the power meter 106. Adapter 110 provides a set of connections, such as lug terminals, for the two AC hot and single neutral connections from the utility company electrical power feed.

Figure 2:
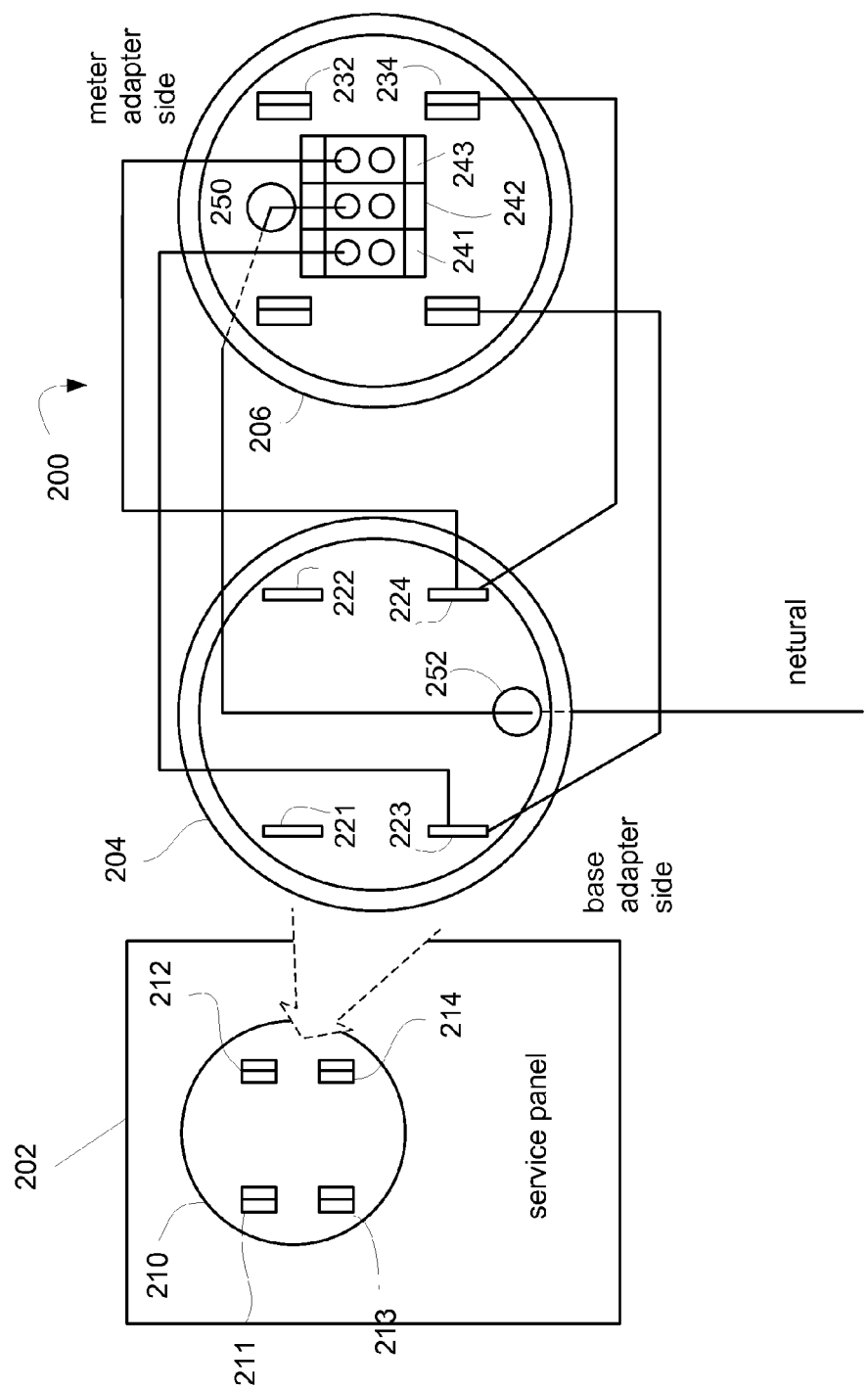
FIG. 2 is a simplified schematic of a back feed adapter system according to another embodiment.

FIG. 2 represents a supply side back feed meter socket adapter embodiment of the present invention, and is referred to herein by the general reference numeral 200. The adapter 200 is intended to plug into a service panel 202 and can be retained by a retainer ring on a lower flange 204. The meter itself can be retained by another ring on an upper flange 206. An opening 210 in service panel 202 provides an access port 252 in which a utility can be plugged into sockets, such as socket jaws 211-214, or other couplers. Instead of a meter, the adapter 200 plugs in with couplers configured to mate with the couplers in the service panel 202, such as jaw blades 221-224, or other couplers.

In some embodiments, jaw blades 221-224 can each be electrically and physically extended into socket jaws 231-234 to accept the meter. Internal wiring brings the two AC hot and one neutral to electrical couplers, such as wiring lugs 241-243. At least one neutral lead is passed through holes 250 and 252 to be wired to the main neutral bus in the service panel. An alternative electrical power generation system, such as photovoltaic system, can be connected directly to wiring lugs 241-243 to back feed power to the utility electrical power distribution grid through the meter. Such back feed will run the meter backwards and can generate revenue for the alternative electrical power generation system owner, lessor, or lessee.

Figure 3:
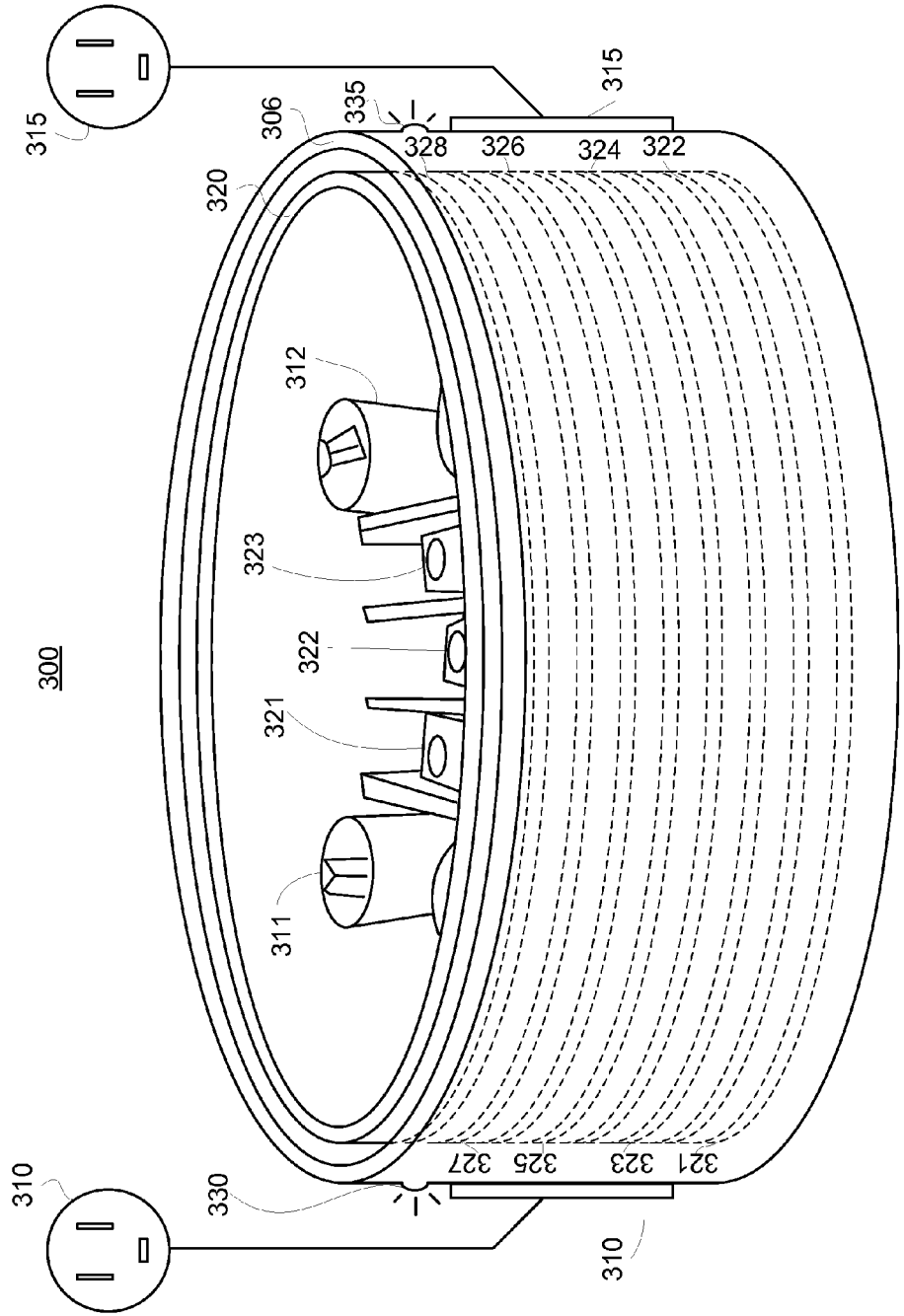
FIG. 3 is a simplified schematic of a back feed meter adapter according to one embodiment.

FIG. 3 represents an adapter 300 that includes two external rotating sockets 310 and 315 for connecting an alternative electrical power generation system, according to an embodiment of the present invention. Adapter 300 can include or be constructed of heavy duty ABS plastic and dimensioned to fit between a meter socket and its corresponding round glass utility meter. However, adapter 300 can include any suitable transparent and opaque materials, such as PVC, metal, and poly carbonate, etc. In some embodiments, the body of adapter 300 can include two concentric cylinders. Internal cylindrical body 320 can be disposed inside external cylindrical body 306. As shown exterior cylindrical body 306 can have an inner diameter and an outer diameter greater than the inner diameter and the outer diameter of the internal cylinder body 320, such that a gap exists between the outer diameter of the internal cylindrical body 320 and the inner diameter of external body 306 to allow movement relative to one another. While the exemplary embodiment which includes cylindrical bodies, such as 320 and 306, are discussed herein, various other shaped housings or body structures can be used without departing from the spirit or scope of the present invention. For example, hexagonal or octagonal internal and external bodies can be used provided that enough space is provided between them to allow for rotational movement relative to one another—or such that the two bodies may be separated, rotated independently, and then reconnected.

In related embodiments, external cylindrical body 306 includes one or more external sockets 310 and 315. External sockets 310 and 315 can be physically and/or electrically coupled to internal cylindrical body 320. In some embodiments, sockets 310 and 315 can be coupled to internal cylindrical body 320 via a track system that includes slots 321 to 328 on or in the exterior surface of internal cylindrical body 320. External clinical body 305 can include conductors extending inward from the interior side of sockets 310 and 315 and configured to be removably or permanently engage with slots 321 to 328. In such embodiments, the conductors extending inward from the interior side of sockets 310 and 315 can rotate relative to the exterior surface of internal cylindrical body 320 while maintaining a conductive connection with the slots 321 to 328.

By the connections formed by the coupling of the conductors extending from the backside of sockets 310 and 315 into the slots 321 to 328, a corresponding electrical plug can be inserted into either socket 310 or 315 and be electrically coupled to one or more of the electrical couplers on the interior of internal cylindrical body 320, such as lug connectors 321, 322 or 323. In other embodiments, slots 321 to 328 can be coupled to the socket connections 311 and 312 in various configurations such that the actual connections made with an external plug with sockets 310 or 315 can be routed to an electrical meter coupled to the top side of adapter 300 and/or the electrical power grid. While only some of the internal connections are shown in the depiction of adapter 300, adapter 300 can include analogous connections, such as jaw sockets, jaw blades, and lug connections shown in reference to the adapter 200 in FIG. 2.

Socket 310 can include conductors extending inward toward the center of the diameter to engage slots 321, 322, and 323 such that the external cylindrical body 306 can rotate relative to internal cylindrical body 320 while maintaining an electrical connection. The conductors can be configured to slide within each of the corresponding slots when the external cylindrical body 306 is rotated relative to the internal cylindrical body 320. Similarly conductors extending inward from the back of socket 315 can be configured to engage slots 324, 325, and 326 to form electrical connections between socket 315 and various connections disposed on the interior of internal cylindrical body 320. The conductors extending inward from the back of socket 315 can also be configured to maintain an electrical connection when the external cylindrical body 306 is rotated relative to internal cylindrical body 320. In such embodiments, the location of the external sockets 310 and 315 can advantageously be positioned to provide a flexible and more convenient connection between one or more local alternative electrical power generators and the utility meter and the service panel to which the adapter 300 is coupled to provide a back feed connection.

By allowing the location of the sockets to rotate around the circumference of the adapter 300, plugs coming from electrical connectors of various local electrical power generators disposed in a various locations, relative to the service panel to which adapter 300 is coupled, can be accommodated. Such flexibility in the location of the external sockets 310 and 320 can assist in minimizing the number of bends or turns of the cables or conductors that route electricity from the local electrical power generators to the adapter 300, thus reducing the costs and time associated with connecting the various local electrical power generators with the adapter 300 and or the local service panel or the utility grid. Such improvements also increase the safety of the connection.

While sockets 310 and 315 are shown being disposed 180° relative to one another, other relative angular displacements are also possible. For example, sockets 310 and 315 can be disposed on the exterior surface of external cylindrical body 306 with relative angular displacements of 90°. In some embodiments, external cylindrical body 306 can be constructed to include two or more cylindrical bodies they can rotate about the same access relative to one another such that socket 310 can be disposed on the exterior surface of one of the component cylindrical bodies while socket 315 can be disposed on the exterior surface of another of the component cylindrical bodies. In such embodiments, sockets 310 and 315 can rotate relative to one another such that each socket can be independently rotated relative to the internal cylindrical body 320.

In some embodiments, adapter 300 can have one or more indicators, such as LEDs 330 and 335, to indicate various statuses or functions associated with adapter 300, the service panel, the electrical meter, or the local alternative electrical power generator to which it is coupled. LEDs 330 and 335 can be coupled to slots 327 and 328 by conductors extending inward from the back of LEDs 330 and 335 such that electrical connection can be maintained while external cylindrical body 306 is rotated relative to internal cylindrical body 320. In some embodiments, each of the slots 321 to 328 can include multiple conductors, i.e. the conductor on either side of each of the slots, such that two conductors extending in from LEDs 330 and 335 can couple to separate and electrically isolated strips of conductors, such that leads and/or conductors extending from the back of LEDs 330 and 335 can be coupled to separate signals.

For example, one lead or conductor of LED 330 can be coupled to one conductor inside slots 327 that provides a nonzero voltage, while a second lead or conductor of LED 330 can be coupled to another conductor inside slots 327, such that LED 330 can be configured to illuminate when various electrical characteristics are achieved with respect to the local alternative electric power generator coupled to external socket 310. For example, LED 330 can be configured via logic and/or circuitry included in adapter 300 to illuminate when electrical power generated by a local alternative electrical power generator coupled to socket 310 is delivering more electrical power via slots 321, 322, and 323 and other internal conductors to the load side of the utility meter coupled to adapter 300 then the utility power is delivering to the meter. This condition, in which electrical power is being fed back into the utility electrical grid is referred to herein as a back feed condition.

As such, LEDs 330 and 335 can indicate when one or more local alternative electrical power generators is back feeding electrical power into the utility grid. Because LEDs 330 and 335 can be configured to be stationary relative to sockets 310 and 315, information indicated by the illumination, shut down, and/or blinking of LEDs 330 and 335 can be configured to indicate information, status, or other functions regarding local alternative electrical power generators coupled to the relative sockets. For example, socket 310 can be coupled to a photovoltaic installation while a wind turbine generator can be coupled to socket 315. On a particularly windy night, indicator light 335 may be illuminated when the wind turbine generator coupled to socket 315 is generating more power that is being used locally, while the LED 330 remain turned off because the photovoltaic system coupled to socket 310 is not producing significant, if any, electrical power.

In related embodiments, LEDs 330 and/or 335 can be configured to blink in one or more colors to indicate various errors, statuses, or faults related to adapter 300 or any component coupled to adapter 300. For example, LED 335 can be configured to blink once every 5 seconds when the local alternative electrical power generator coupled to socket 315 is operating normally. Alternatively, LED 335 can be configured to blink rapidly to indicate that alternative power generator coupled to socket 315 is experiencing an error. In such embodiments, the rate, color and/or pattern with which LED 335 blinks can indicate specific faults and errors.

Each of slots 321 to 328 can be coupled to a specific electrical coupler or connection with an adapter 300 so as to couple each prong of a plug coming from a local alternative electrical power generator to the appropriate electrical connections and components of the service panel, adapter 300 or utility meter. For example a plug coming from a local alternative power generator can include a neutral prong that needs to be coupled to the ground or neutral lug connection 322. In such embodiments, the neutral prong can be coupled to slots 321 on the internal cylindrical body 320. The conductor in the slots 321 can be coupled to lug connection 322 it is also coupled to the ground or neutral wire coming from the service panel to which adapter 300 is coupled. Similarly the two hot AC electrical prongs of a plug coming from a local alternative power generator can be coupled to slots 322 and 323. The conductors in a slots 322 and 323 can be coupled to the load side couplers 311 and 312 of adapter 300. The connections between slots of 321, 322, and 323, lug connectors or other couplers with an adapter 300 can be static because internal cylindrical body 320 can be configured to remain stationary relative to the connectors disposed on the interior of adapter 300.

While not shown, cylindrical bodies 320 and 306 can include a flange on one end of adapter 300 for a retaining ring for coupling the adapter 300 to a service panel, and another flange for a retaining ring to couple adapter 300 to a meter. In some embodiments, the flanges are attached to or integral to the exterior surface of external cylindrical body 306 at the top and bottom edges. Grounding straps can be included around the flanges to ground the retaining rings. A set of four socket jaws 311-314 are provided to make the electrical connections to the utility meter inputs and outputs. Wiring lugs 241, 242, and 243 are provided to terminate back feed connections from the slots on the internal cylindrical body 320.

Figure 4:
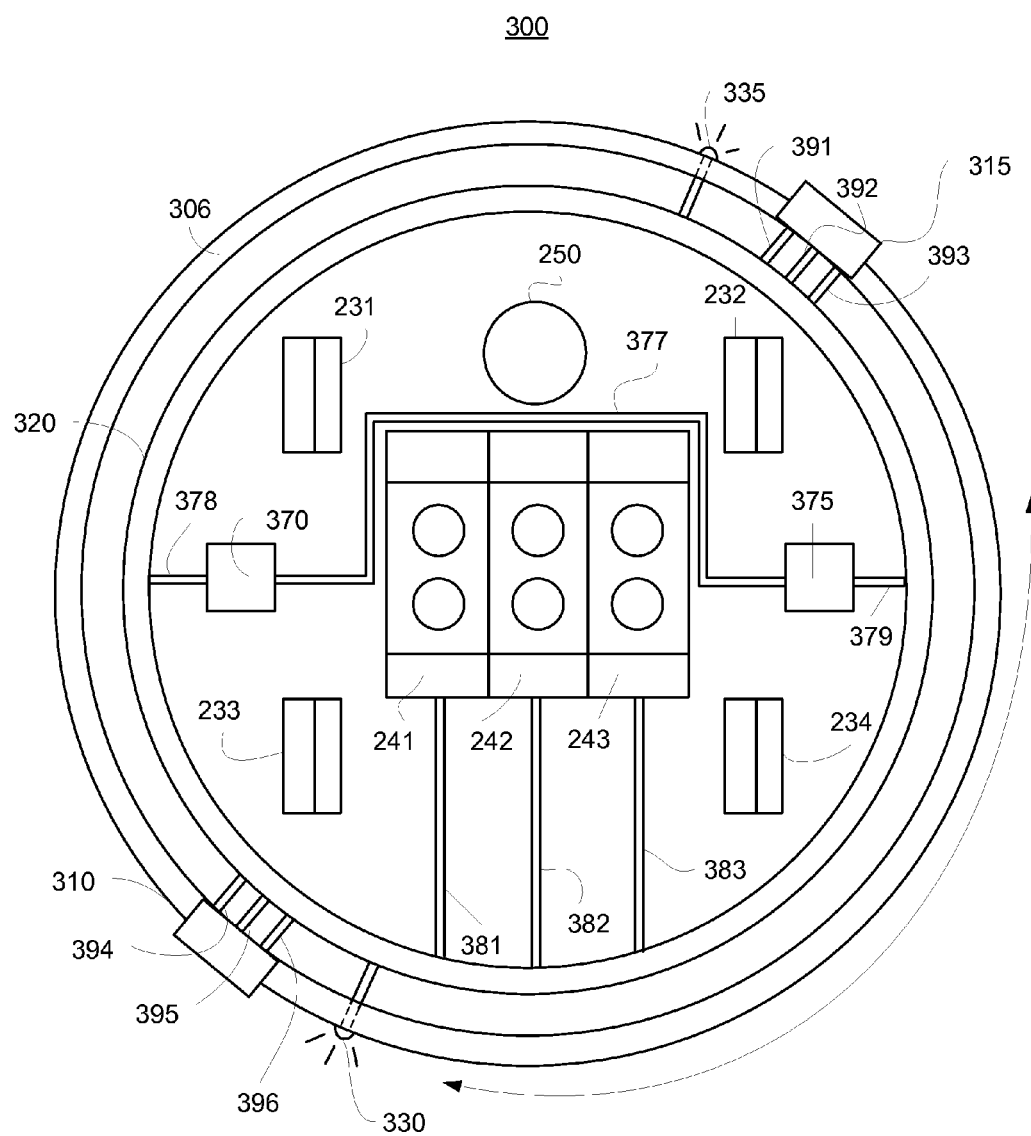
FIG. 4 is a simplified top view schematic of a back feed meter adapter according to one embodiment.

FIG. 4 shows a top view of adapter 300 that shows the various connections described above. Socket 310 disposed on or in the external cylindrical body 206 can include conductors, such as pins 394, 395, and 396 that extend inward toward the outer surface of internal cylindrical body 320 to engage the slots disposed therein. Similarly socket 315 can include conductors, such as pins 391, 392, and 393 that extend inward towards the outer surface of internal cylindrical body 320 to engage the slots disposed therein. LEDs 330 and 335 are also shown having conductors extending inwards towards the outer surface of internal cylindrical body 320 to engage the slots disposed therein. The conductors extending from sockets 310 and 315 and LEDs 330 and 335 can be configured to engage the slots disposed in the exterior surface of internal cylindrical body 320 such that external cylindrical body 306 can be rotated relative to the internal cynical body 320 while maintaining physical and electrical connections between sockets 310 and 315 and LEDs 330 and 335 with the slots disposed of any outer surface of internal cynical body 320.

FIG. 4 also shows the connections 381, 382, 383 between lug connectors 241, 242, 243 and the conductors in the slots disposed on the outer surface of the internal cylindrical body 320. Connections 378 and 379 can be coupled to the conductors in the slots to which LEDs 330 and 335 are coupled. In some embodiments, connections 378 and 379 can be coupled to one another via logic and/or power circuitry represented by modules 370 and 375. In such embodiments, modules 300 7375 can be configured to detect back feed conditions during which surplus or otherwise unused electrical power generated by local alternative power generator is being fed back to utility grid.

Figure 5:
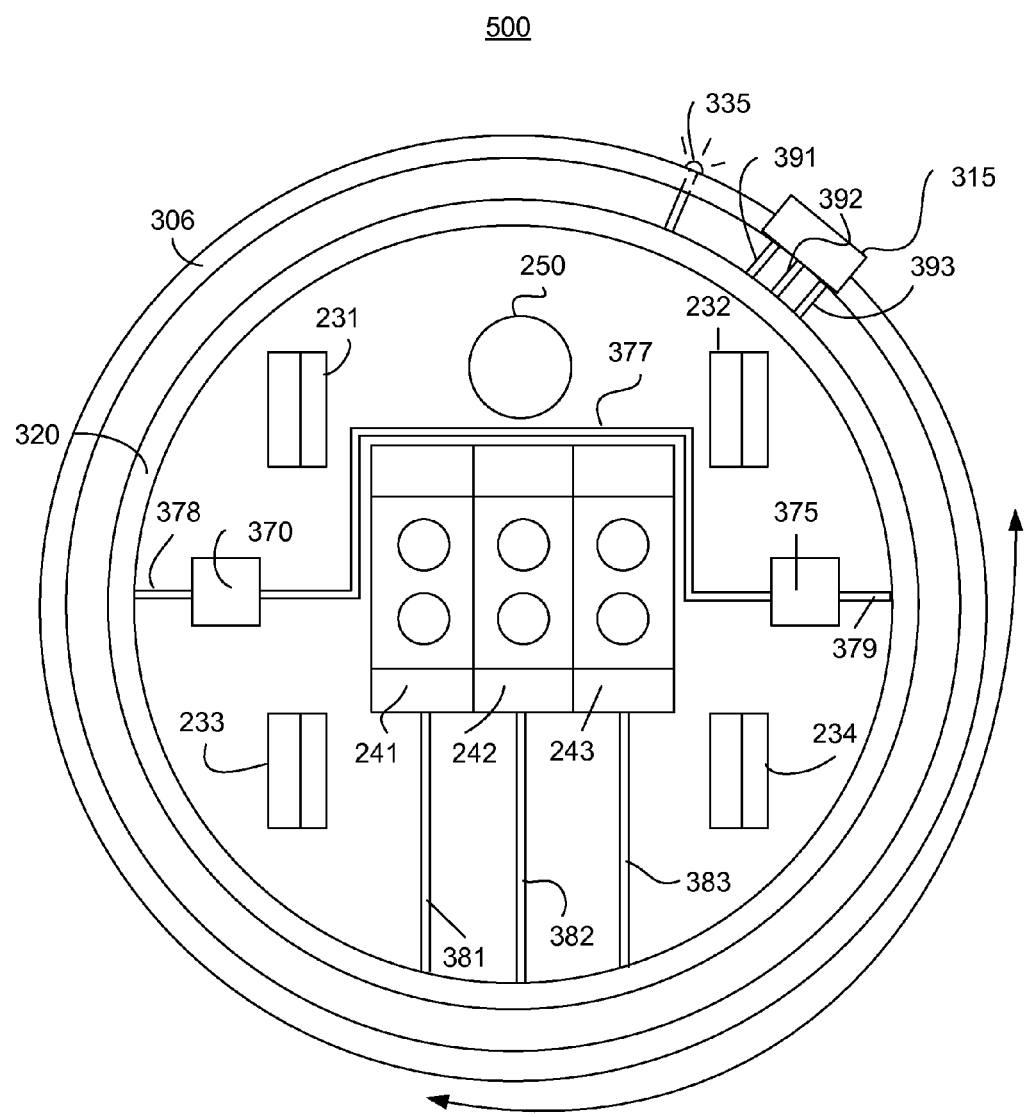
FIG. 5 is a simplified top view schematic of a back feed meter adapter according to one embodiment.

FIG. 5 depicts an adapter 500 according to another embodiment of the present invention having a single external socket 315 and single indicator LED 335 disposed in or on the outer surface of external cylindrical body 306. In such embodiments, all other components can be identical to that described above in reference to FIGS. 3 and 4, but with the same number or fewer slots configured to engage conductors 391, 392, and 393, and the conductor from LED 335.

Figure 6:
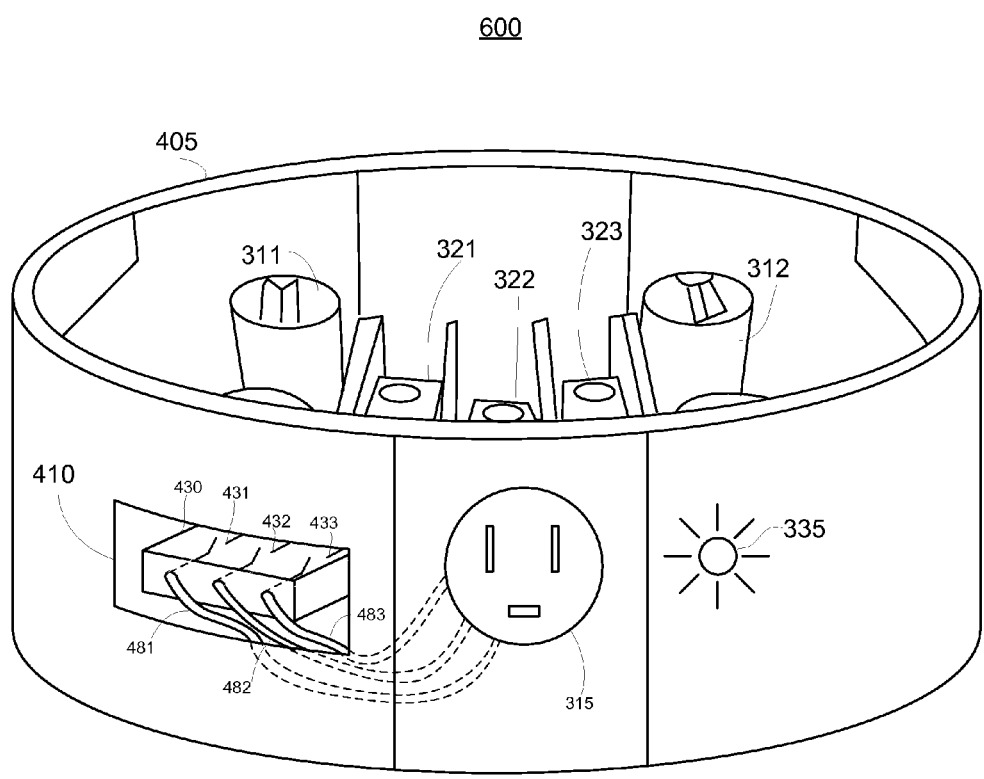
FIG. 6 is a simplified schematic of a back feed meter adapter according to another embodiment.

FIG. 6 depicts an adapter 600 according to yet another embodiment of the present invention. Adapter 600 can include a stationary external socket 315 on or in the exterior surface of cylindrical body 405. In such embodiments, the cynical body 405 can include an open window or a window with a transparent covering so users, such as an installer or technician, can view the connections 481, 482, and 483 that couple the receptacles of socket 315 with an electrical switch 430. In such embodiments, the switch 430 can have visible switches 431, 432, and 433 that can be viewed via window 410 such that a user can visually confirm that the switches are in an on or off state. Such visibility into the state of the switches 431, 432, 433 of the electrical switch 430 provides an extra level of protection against shock or electrocution for users installing or servicing adapter 600 or the service panel or utility meter to which it is coupled. Using window 410, a user can visibly confirm that the connections in switch 430 are in an open state prior to connecting a local alternative local power generator to socket 315, removing adapter 600 from the service panel, or removing the meter from the adapter 600.

Figure 7:
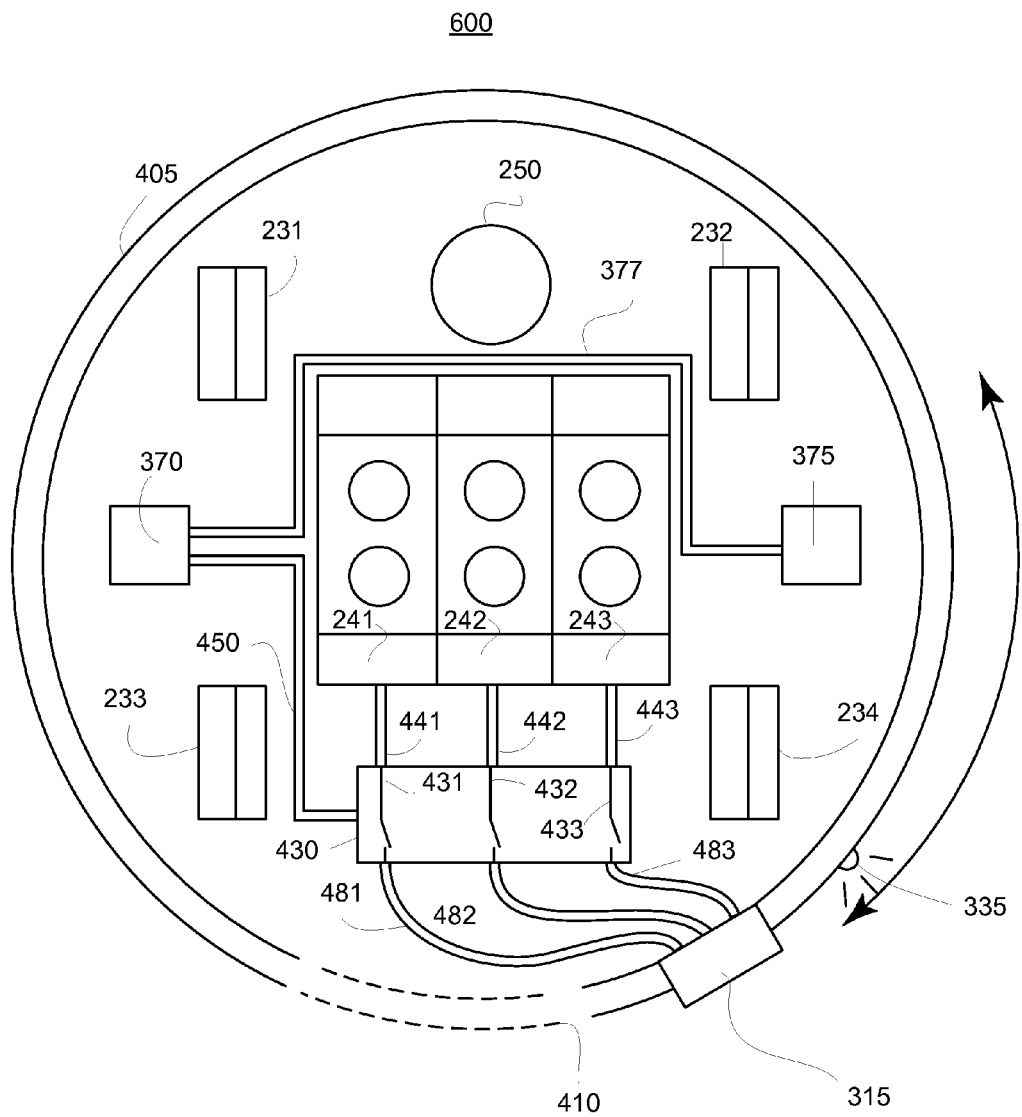
FIG. 7 is a simplified top view schematic of a back feed meter adapter according to yet another embodiment.

FIG. 7 shows a top view of a variation of adapter 600 according to various embodiments of the present invention. As shown, adapter 600 can include a cylindrical body 405 that can rotate relative to the other components disposed in the interior of cylindrical body 405. In such embodiments, couplers 231, 232, 233, and 234, as well as modules 370 and 375, switch 430, and lug connectors 241, 242, and 243, can all be mounted on a bottom plate to which cylindrical body 405 can be rotatably coupled. In such embodiments, modules 370 and 375, can include sensors electrical meters for detecting back feed conditions. Modules 370 and 375 can be coupled to one another via connection 377 and to switch 430 via connection 450. The receptacles of socket 315 can be coupled to lug connectors via switch 430 and the shown wire connections. Wires 341, 342, 343 can be dimensioned to allow various rotational degrees of freedom of socket 315 relative to switch 430 and clinical body 405 is rotated.

Figure 8:
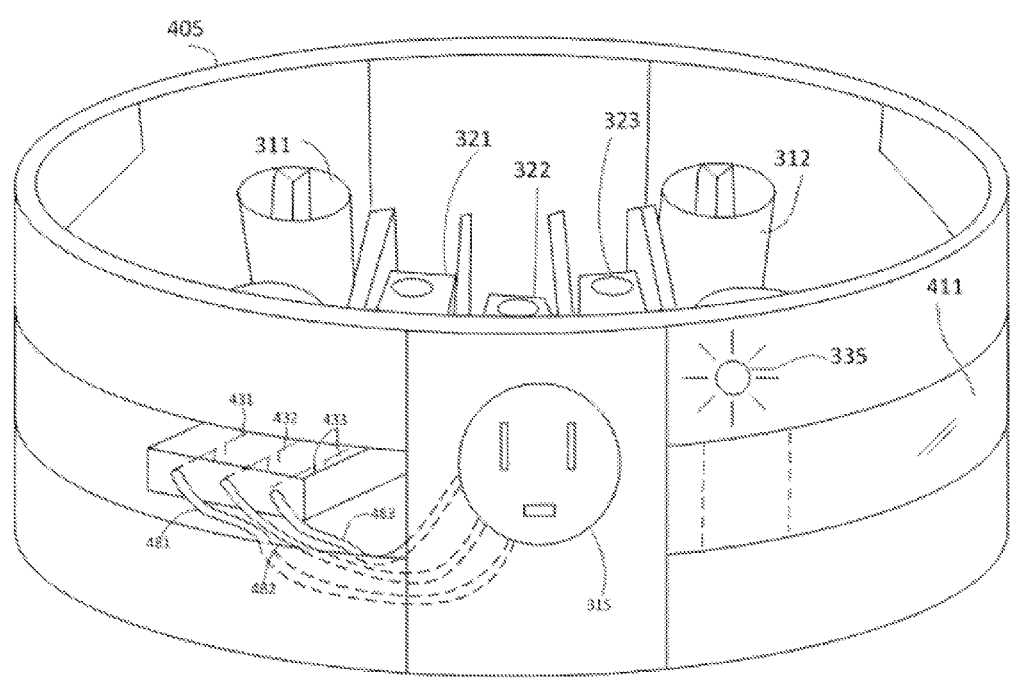
FIG. 8 is a simplified schematic of a back feed meter adapter according to one embodiment.

FIG. 8 shows an adapter 800 according to one embodiment of the present invention. As shown, window 410 of adapter 600 has been replaced by window 411 that encompasses almost the entire circumference of cylindrical body 405. Increasing the expanse of window 410 to that of window 411 provides an extra degree of rotational freedom and allows light to enter the interior of adapter 800 when it is installed on a service panel with a utility meter thus allowing for greater visibility to visually determine the state of switches 431, 432, and 433. Such increased visibility can further enhance the safety characteristics of adapter 800.

Figure 9:
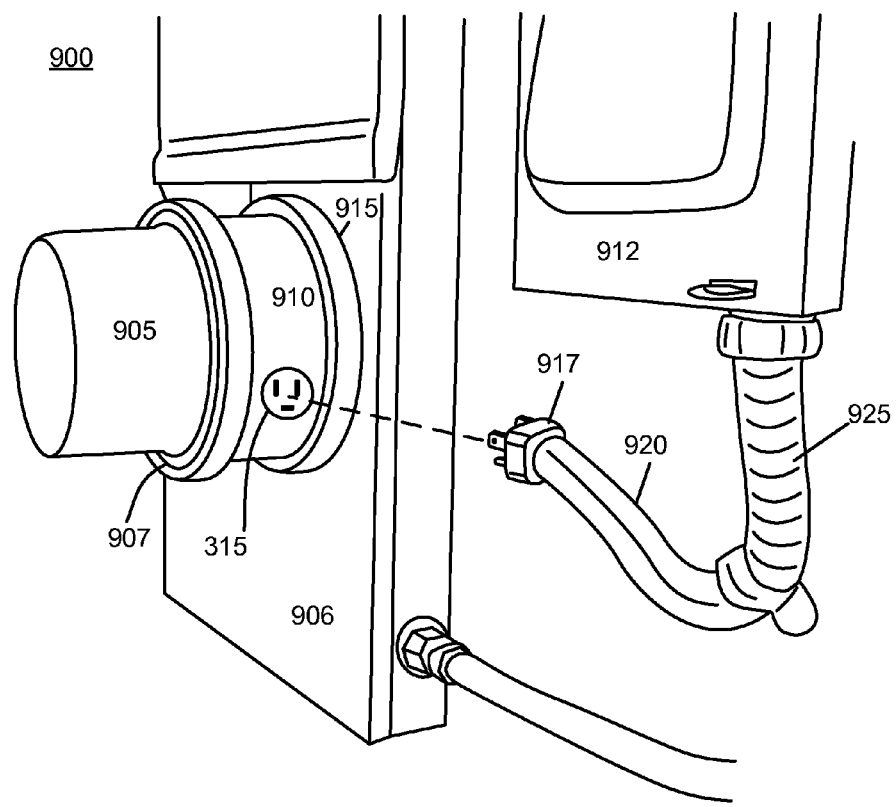
FIG. 9 is a simplified schematic of installed back feed meter adapter according to various embodiments.

FIG. 9 shows installation of a second meter adapter 910 on a service panel 906 with a utility meter 905. As shown, meter 905 is coupled to base-meter adapter 910 by a retaining ring 907. Base-meter adapter 910 can be coupled to the service panel 906 via retaining ring 915. According to various embodiments of the present invention, external socket 315 can be rotated around the circumference of base-meter adapter 910 so that external socket 315 can face the direction be disposed to be conveniently and easily connected to an alternative electrical power generation system 912 via connection 920 having a plug 917. While base-meter adapter 910 is shown as having only a single external socket 315, embodiments of the present invention can also include multiple external socket 315 for coupling multiple alternative electrical power generators to base-meter adapter 910.

FIG. 9 also shows a principal advantage of using the adapters and methods of the present invention in the installation of alternative electrical power generator systems in homes with pre-existing electrical service. An installation 900 can use a supply side back feed meter socket adapter 910 inserted between a power meter 905 and a preexisting wall-mounted service panel 906. The connection 920 and plug 917 coupled to the side of adapter 910 and a flexible conduit 925 allows back feed wiring to an alternative electrical power generation system mains panel or invertor 912. The installation of the alternative electrical power generation system is simplified by eliminating the need to make changes to the pre-existing wall-mounted service panel 906. In some embodiments, lead or plastic tamper seals can be installed by the utility to expose any attempts at tampering or theft of electrical services.

Figure 10:
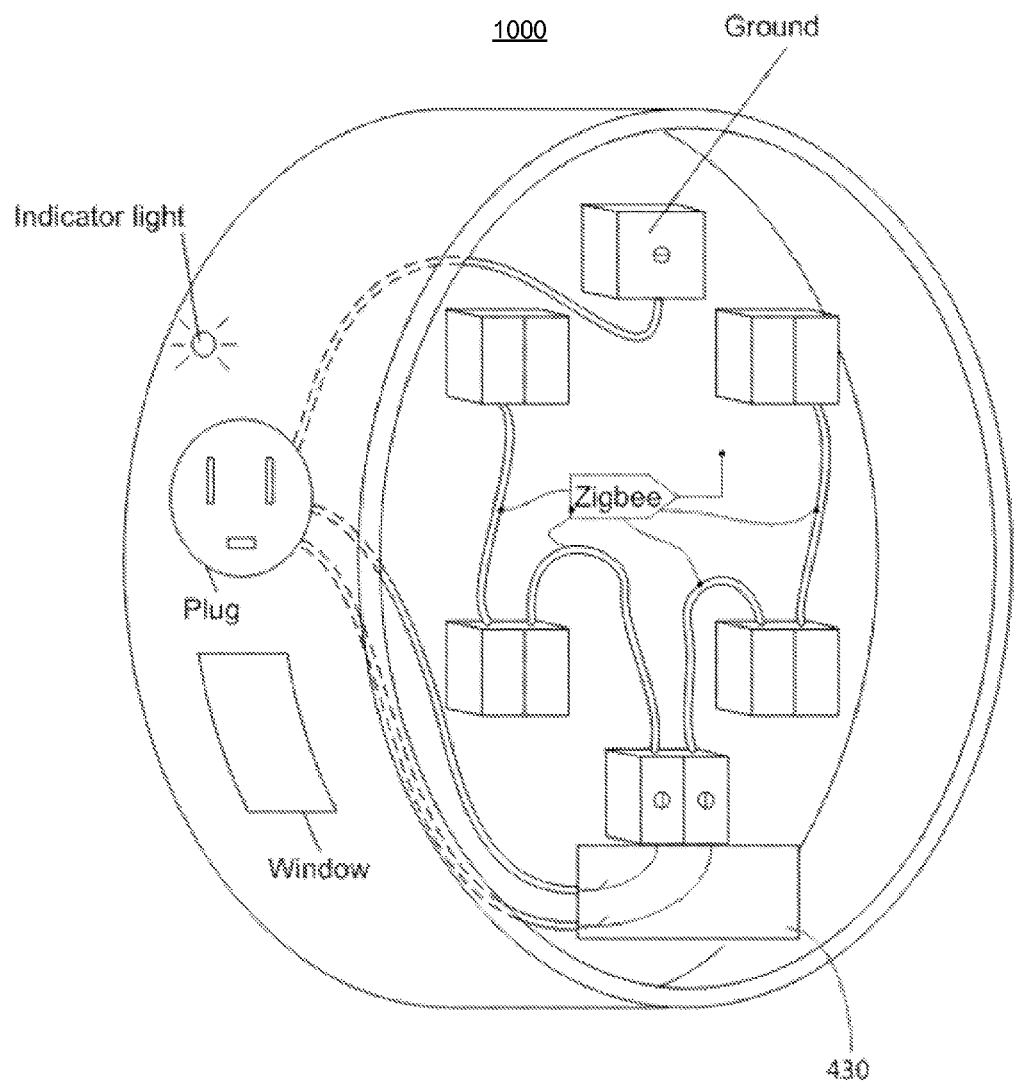
FIG. 10 is a simplified schematic of a back feed meter adapter that includes wireless networking capabilities.

FIG. 10 shows an exemplary variation 1000 according to various embodiments of the present invention. In such embodiments, each electrical connection disposed in the interior of the cylindrical body can be monitored and controlled by a wireless networking component. In one specific embodiment, the wireless networking component can include a Zigbee™ enabled networking wireless component that can monitor, track, and control the states of the various connections of the base-meter adapter such as switch 430 and the jaw connectors. While one specific wiring and monitoring configuration is shown in FIG. 10, other variations in configurations can include wireless networking communication, monitoring, tracking, and control of the various components of other embodiments described herein are also possible.

Figure 11:
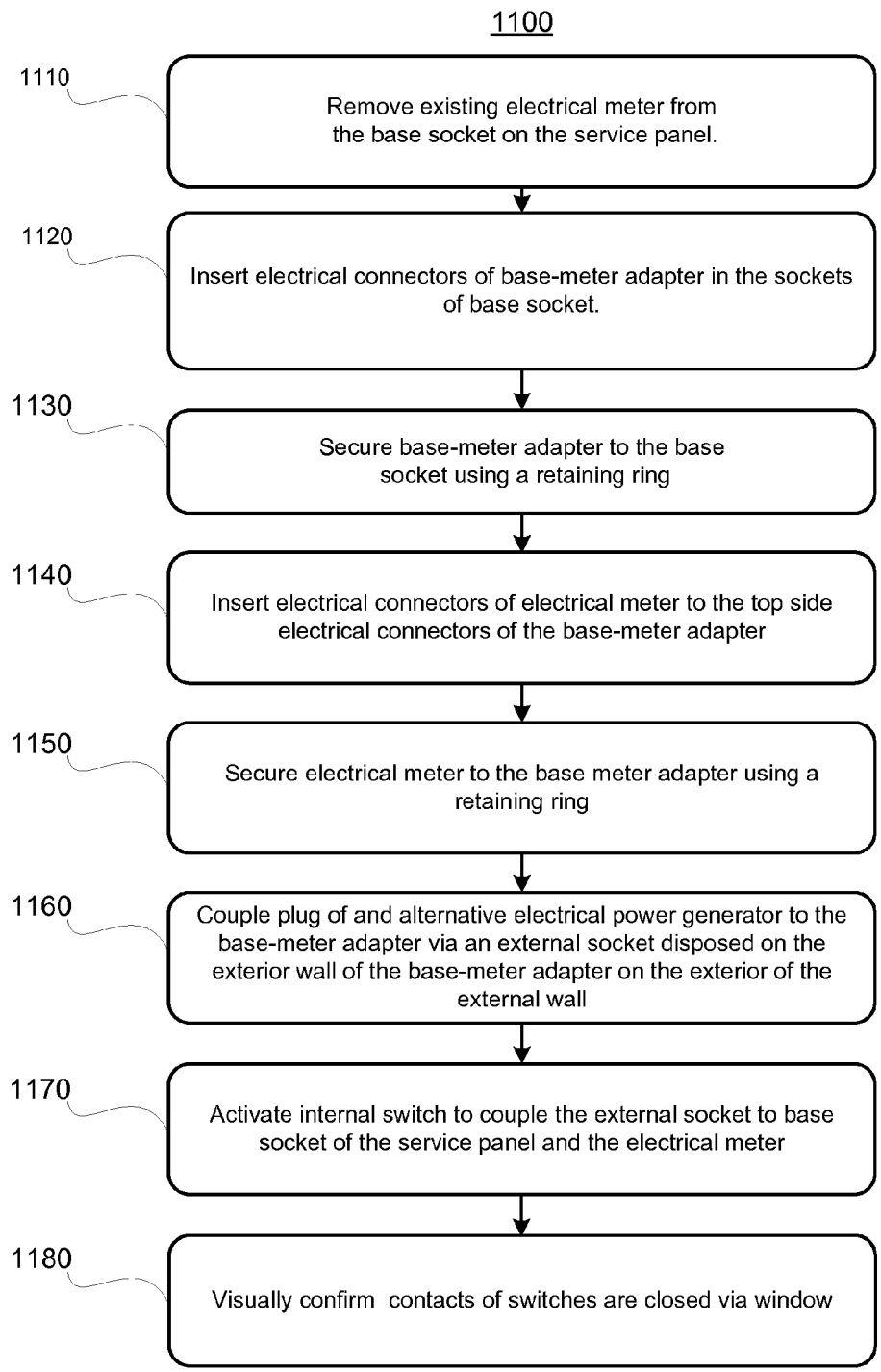
FIG. 11 is a flowchart for a method for installing a back feed meter adapter on the existing electrical service panel with an existing meter socket.

FIG. 11 is a flowchart of a method 1100 for installing a base-meter adapter according to various embodiments of the present invention. For existing installations of a distribution panel having an electrical meter attached thereto, the method 1100 can begin by removing the existing electrical meter from the base socket on the service panel in action 1110. Once the existing electrical meter is removed from the base socket of the service panel, the base-meter adapter can be coupled to the base socket by inserting the electrical connectors of the base-meter adapter into the receptacles of the base socket 1120. In such embodiments, inserting electrical connectors of the base-meter adapter mimics the connections of the electrical meter that was previously installed in the base socket service panel. To secure the base-meter adapter to the base socket of the service panel, a retaining ring can be used to couple the base meter adapter to the base meter socket via one or more flanges of the base-meter adapter and/or the base socket of the service panel, in action 1130.

With the base-meter adapter coupled to the base socket of the service panel, electrical connectors of the electrical meter can be coupled to the top side of the electrical connectors of the base-meter adapter, in action 1140. Coupling the electrical meter to the base-meter adapter couplers mimics the previous connection between the electrical meter and the base socket of the service panel. With the meter in place, physically and electrically coupled to the base-meter adapter, the electrical meter can be secured to the base-meter adapter using a retaining ring that engages one or more flanges disposed on the electrical meter and/or the base-meter adapter, in action 1150. In some embodiments, the external socket on the exterior surface of the base-meter adapter can be rotated relative to the internal connections of the base-meter adapter to position the external socket in a desired location relative to the service panel and any external system to which it will be coupled, such as a local alternative electrical power generator system. Rotating the location of the external socket can occur before after the base-meter adapter is secured to the base socket in the service panel or the electrical meter using the retaining rings.

With the external socket disposed at a desired position relative to the service panel and a local alternative electrical power generator, a plug coupled to the local alternative electrical power generator can be coupled to the external socket using various types of male-female plugs and sockets, in action 1160. In some embodiments, the external socket or the plug it coupled to the local alternative electrical power generator can include a securing element, such as a retaining ring or set screw, to avoid unintentional decoupling of the plug from the external socket. Once all the electrical connections are made, the internal switch that couples the external socket to the base socket of the service panel and the logical meter can be activated, in action 1170. In various embodiments, a user can visually confirm that the context of the internal switch are in the closed position using a window disposed in the external wall of the base-meter adapter, in action 1180.

Figure 12:
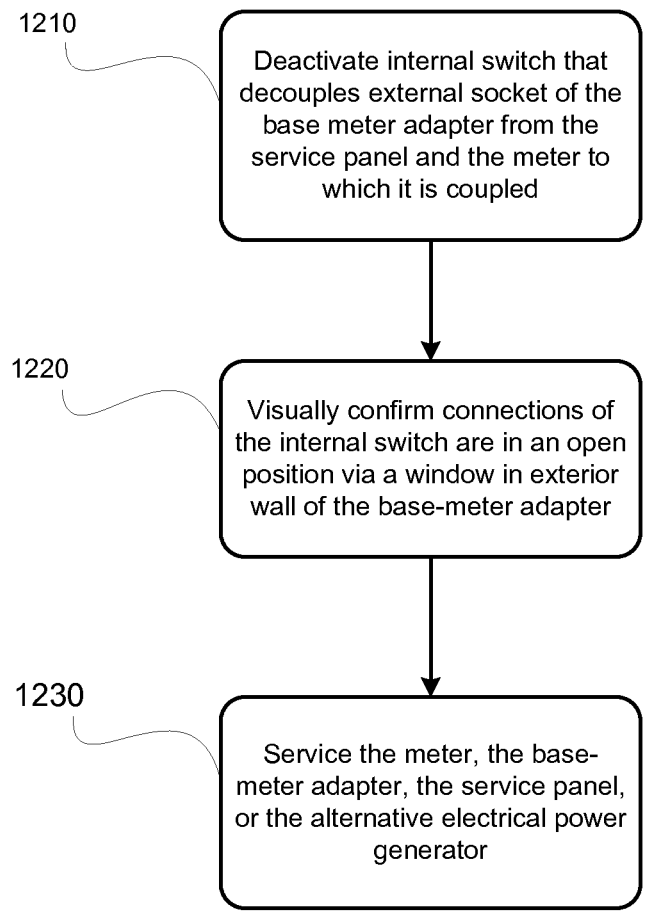
FIG. 12 is a flowchart for a method for servicing or deactivating a back feed meter adapter on the existing electrical service panel.

FIG. 12 is a flowchart of a method 1200 for removing or servicing the base-meter adapter, or components coupled thereto, according to various embodiments of the present invention. In action 1210, a user, such as a technician, can deactivate an internal switch of the base-meter adapter that decouples the external socket of the base-meter adapter from the service panel and/or the meter to which it is coupled. A user can then visually confirm that the connections of the internal switch is in an open position, or off state, via a window in the exterior wall of the base-meter adapter as a final safety precaution before opening or otherwise removing the base-meter adapter from the service panel, or the meter from the base-meter adapter, in action 1220. Finally, the meter, the base-meter adapter, the service panel, or the alternative electrical power generator system can be serviced, in action 1230.

Figure 13:
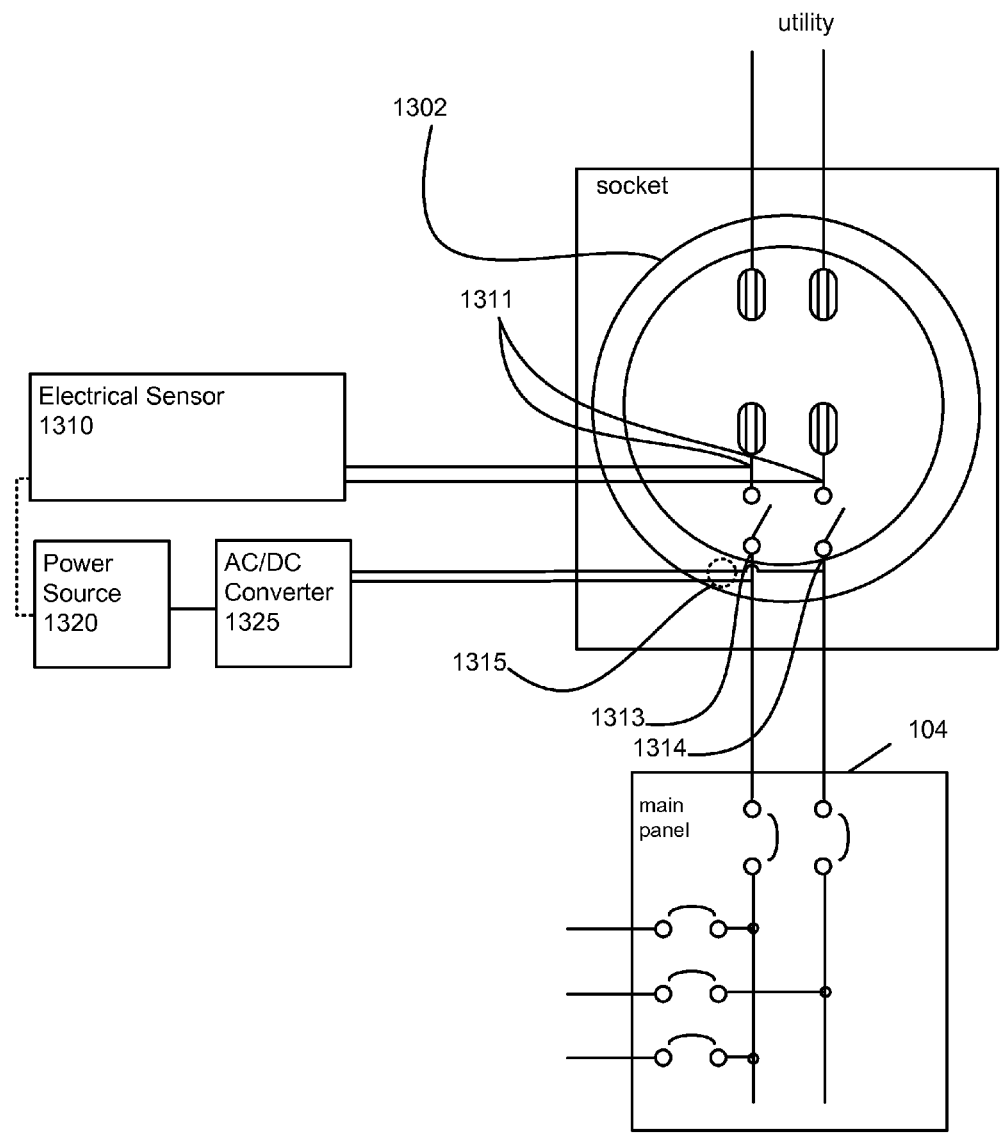
FIG. 13 is a simplified schematic of installed back feed meter adapter with a switchable local power source, according to various embodiments.

Another embodiment of the present invention is shown in FIG. 13. In such embodiments, meter socket adapter 1302, which can include various features of other embodiments described herein, can also include AC disconnect and over current switches 1313 and 1314. In such embodiments, switches 1313 and 1314 can be opened manually or automatically in response to various conditions of the electrical meter or electrical utility power supply. For example, in some embodiments, electrical sensor 1310 can monitor and sense the characteristics, i.e. voltage, current, and frequency, of the electrical power supply on the main panel side at points 1311. While it is possible to measure the characteristics of the electrical power supply going through the meter socket adapter 1302 and the meter coupled thereto at various points in the meter socket adapter 1302, it is advantageous in various embodiments to measure electrical power supply characteristics at points 1311 in order to detect characteristics of the electrical power supply after going through the meter socket adapter 1302 and the meter.

The electrical sensor 1310 can be automatically or manually programmed or configured to detect various conditions and characteristics of the electrical utility power supply. In related embodiments, electrical sensor 1310 can be accessed either locally, i.e. at the location of electrical sensor 1310, or remotely using one or more open standard or proprietary networks to communicate with electrical sensor 1310 from a remote location. In accordance with such embodiments, electrical sensor 1310 can be programmed to open switches 1313 and 1314 when any one or more of various predetermined or dynamically determined electrical utility power supply characteristic value range conditions are not met. For example, electrical sensor 1310 can be programmed to measure and monitor the voltage, frequency, and current of the alternating current of the electrical utility power supply. If the voltage, frequency, or current of the electrical utility power supply deviates from one of the predetermined or dynamically determined acceptable ranges, the electrical sensor 1310 can open switches 1313 and 1314, thus disconnecting the main panel 104 from the electrical utility power supply.

In some embodiments, the acceptable ranges can be defined by UL 1741, IEEE 1547 or other standards which require that the electrical utility power supply stay within +/−5% of the nominal voltage and frequency values, i.e. 120V and 60 Hz. In other embodiments, the acceptable ranges can be determined based on electrical power consumer preference settings aimed at reducing utility costs based on peak current billing practices. While industrial consumers of electrical power can usually operate locals loads at a relatively constant electrical currents, they may be billed for an entire month based on peak current value they draw for any given time period within that month. Accordingly, in various embodiments the present invention, the acceptable range can be based on a maximum peak current value based on consumer preferences to reduce the cost associated with drawing high-current power from the electrical utility power supply or grid.

If the electrical sensor 1310 detects or otherwise determines that any one of the characteristics of the electrical utility power supply deviates outside of one of the acceptable ranges, it can be configured to open switches 1313 and 1314 to disconnect the main panel 104 from the electrical utility power supply and then activate power source 1320 to deliver power to the panel side connection of switches 1313 and 1314. Disconnecting electrical utility power supply from the main panel 104 and activating power source 1320 supply backup electrical power can advantageously protect various critical local loads from under-current, over-current, over-voltage, under-voltage, and incorrect AC current frequency conditions. Additionally, opening the switches 1313 and 1314 also prevents back feeding power from the auxiliary or backup power source 1320 back into the electrical utility grid. This advantageously prevents power from being lost to the grid as well as protecting the safety electrical grid technicians, operators, and components.

In embodiments in which the power source 1320 is a DC electrical power supply, i.e. a battery, photovoltaic cell, or electrical vehicle, the power source 1320 can be coupled to the main panel 104 through AC/DC converter 1325. In some embodiments, the AC/DC converter 1325 can be included in the power source 1320. In other embodiments in which the power source 1320 is alternating current (AC) power source, i.e. gasoline, natural gas, diesel or wind turbine generator, the AC/DC converter 1325 can be omitted.

In related embodiments, electrical sensor 1310 can communicate or be coupled to the power source 1320 and electrical characteristic sensors within the meter socket adapter 1302 through various wired and wireless communication standards. In some embodiments, electrical sensor 1310 can be included within the housing of the meter socket adapter 1302 and include sensors or leads at points 1311. In other embodiments, discrete electrical characteristic sensors can be installed at points 1311 and be configured to communicate wirelessly with electrical sensor 1310 that is disposed externally to the meter socket adapter 1302. In either of such embodiments, electrical sensor 1310 can be coupled to or in communication with the power source 1320 by various wired and wireless communication standards and protocols. In some embodiments, the power source 1302 can include electrical sensor 1310. For example, an auxiliary or backup battery module can include both the battery cell, a charging regulator for charging the battery cell, and AC/DC converter 1325, as well as circuitry or logic for performing the functions of the electrical sensor 1310 that can detect electrical characteristics from the electrical utility power supply.

By having switches 1313 and 1314, electrical meter socket adapter 1302 can be installed on an existing electrical utility socket and provide an access port for 1315 through which backup or supplementary power supplies, such as power source 1320, can be coupled to the main panel to supply emergency or backup power to local loads. Such embodiments allow for the fast and efficient installation of backup power without the need to reroute or rewire various leads from the existing connections to a critical loads panel that is additional to and external to main panel 104. Such implementations not only reduce the costs and complexity of installing an auxiliary or backup power supply, they also increase the safety and reliability by reducing the number of fault points in the system. Additionally, various electrical power consumers may wish to limit their exposure to unexpected costs due to unexpected peak current draws by programming sensor 1310 to open switches 1313 and 1314 and activate one or more auxiliary or backup power supplies for periods during which electrical power consumer is drawing more than some predetermined threshold level of current. Once the local load has stopped drawing more than the threshold current, electrical sensor 1310 can deactivate the auxiliary or backup power source and close the switches 1313 and 1314 to resume operation using the electrical utility power supply.

Figure 14:
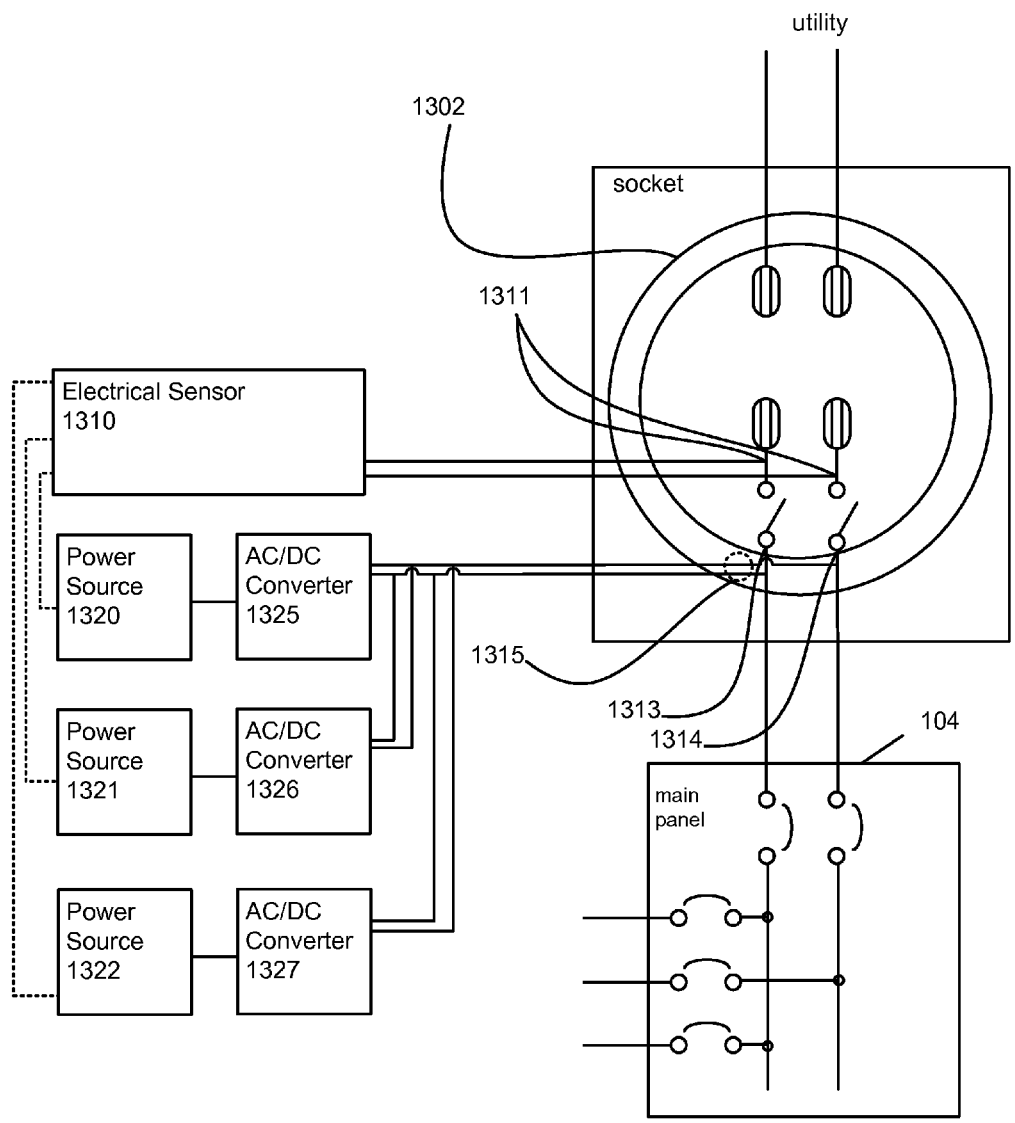
FIG. 14 is a simplified schematic of installed back feed meter adapter with switchable local power sources, according to various embodiments.

FIG. 14 illustrates another simplified schematic of another embodiment of the present invention that includes multiple auxiliary backup power sources 1320, 1321, and 1322. In such embodiments each power source include similar or disparate types of auxiliary or backup powers supplies, such as batteries, generators, photovoltaic systems, wind turbine, fuel cells, etc. In such embodiments, each of the power sources 1320, 1321, and 1322 can be coupled to panel-side terminals of switches 1313 and 1314 through the knockout port or coupler 1315 of meter socket adapter 1302 via respective AC/DC converters 1325, 1326, and 1327. Each of such multiple backup or ancillary power sources can be in communication with or coupled to electrical sensor 1310 via various proprietary or open standard wired and wireless connections. In some embodiments, each one of the multiple power sources 1320, 1321, and 1322 can be linked to one another in parallel or in series depending on the electrical power requirements of the main panel and the local loads and the capability of each one of the respective auxiliary or backup power sources.

Figure 15:
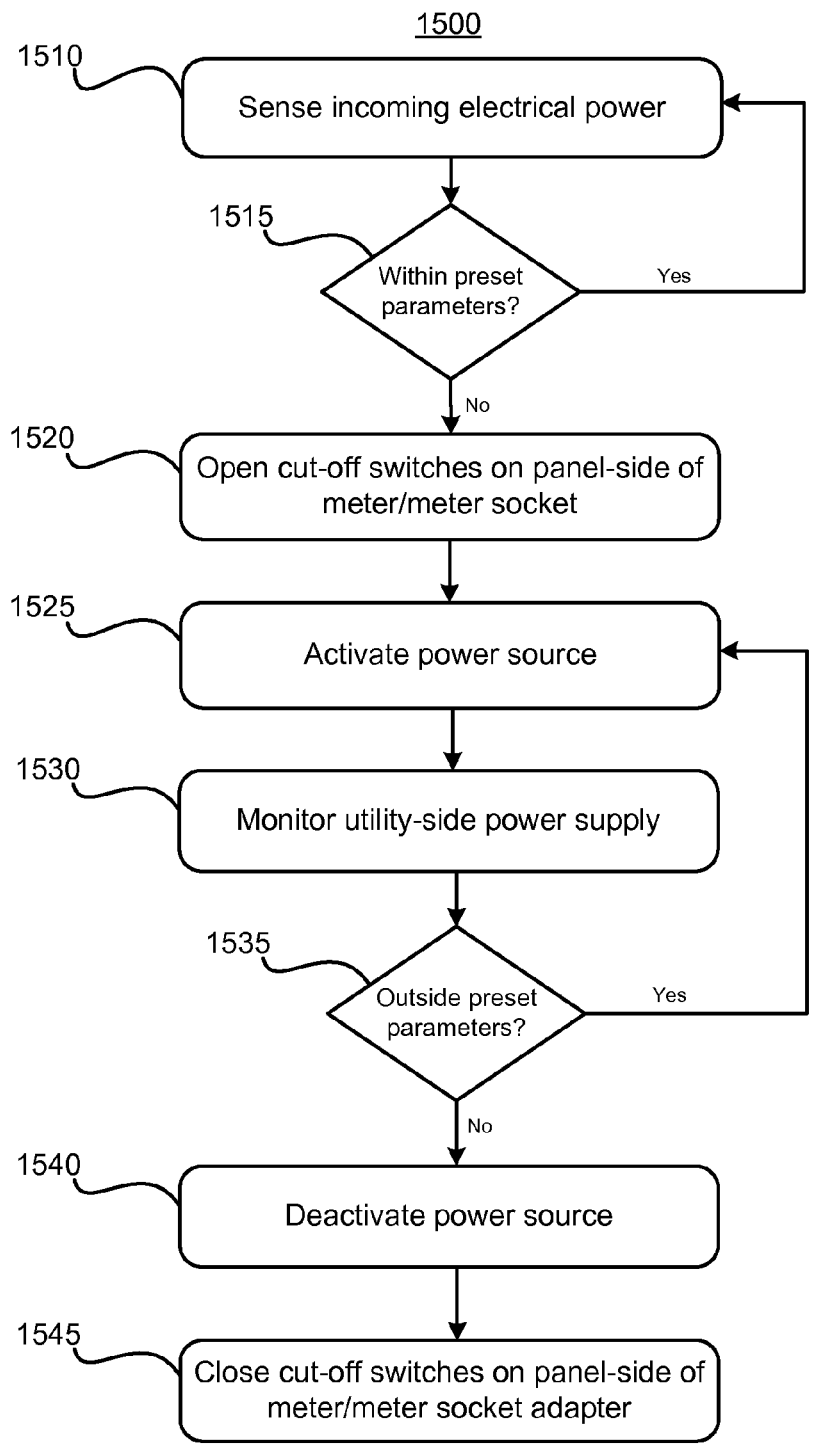
FIG. 15 is a flowchart for a method operating a back feed meter adapter local power source switches, according to various embodiments of the present invention.

FIG. 15 is a flowchart of a method 1500 according to various embodiments of the present invention. Such methods can begin at action 1510 in which a device, such as electrical sensor, can sense the characteristics of the incoming electrical power from an electrical power utility grid. Electrical sensor can determine whether or not the various characteristics of the incoming electrical power are within acceptable predetermined parameters, in action 1515.

For example, electrical sensor can measure the incoming frequency, voltage, or current through the electrical meter socket, the meter, and the meter socket adapter. In such embodiments, it is advantageous to measure each one of such characteristics on the panel side terminals of the electrical meter socket so as to best measure the characteristics of the electrical power supply being coupled to the local main panel. If the electrical sensor determines that electrical power supply from the electrical power utility is within normal parameters, it continues to sense the incoming electrical power in action 1510. However, if electrical sensor determines that the characteristics of the incoming electrical power supply is not within the predetermined parameters, and the electrical sensor can open cutoff switches on the panel side of the meter socket adapter, in action 1520. In such embodiments the cutoff switches can be disposed internally or externally to the meter socket adapter.

With the cutoff switches of the meter socket adapter in the open position, the electrical sensor, or other logic within the meter socket adapter, can activate one or more auxiliary or backup power sources in action 1525. In some embodiments, the opening of cutoff switches and the activation of the auxiliary or backup power supplies can be synchronized so to prevent spikes and troughs in the power delivered to the main panel, thus reducing or avoiding any interruption in power to the local load.

In various embodiments, each of the auxiliary or backup power sources can be coupled to the main panel side connections inside the meter socket adapter through a configurable access port in the body of the meter socket adapter. The access port can include a simple knock-out type access port through which cables or conduit can be routed. In other embodiments, the access port can include an open standard or proprietary plug or socket with stationary or movable leads or wires connected to the main panel-side terminals of the meter socket adapter. In either of such embodiments, the location of the meter socket access port can be rotated about one or more axes of the meter socket adapter and/or the existing socket to position the access port so as to be easily, efficiently, and safely connected to one or more auxiliary or backup power sources. Such auxiliary or backup power sources can include DC electrical power sources such as batteries, fuel cells, photovoltaics, etc. Such DC power sources can include or be connected to the meter socket adapter via an AC/DC power converter. The auxiliary or backup electrical power sources can also include AC electrical power sources, such as gasoline, diesel, natural gas, and wind turbine powered generators.

While the auxiliary or backup electrical power source is activated, electrical sensor can continue to monitor the utility-side electrical power supply, in action 1530. If the electrical sensor determines the characteristics of the electrical power utility grid are outside of the preset parameters, in action 1535, then the electrical sensor or other logic can open one or more cutoff switches in the meter socket adapter. If the electrical power utility grid characteristics remain outside of the preset parameters, then the logical sensor can maintain the activation of the auxiliary or backup power source. However, if the electrical sensor determines that the characteristics of the electrical power utility grid have returned to be within the preset parameters, the electrical sensor can deactivate the auxiliary or backup power source in action 1540 and close the cutoff switches on the main panel-side of the meter socket adapter to reconnect the main panel to the electrical power utility grid in action 1545. Some embodiments then go back to sensing the incoming electrical power characteristics in action 1510 indefinitely or for as long as there is a local load coupled the main panel.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Elements and features described in reference to various embodiments can be used in combination with elements and features of any other embodiments described herein. Based on the above disclosure and the following claims, other arrangements, embodiments, implementations and equivalents will be evident to those skilled in the art and may be employed without departing from the spirit and scope of the invention as defined by the claims.

What is claimed is:

1. A supply side back feed meter socket adapter, comprising:
   a cylindrical body having an interior surface and an exterior surface and dimensioned to couple to an existing utility power meter;
   a first set of electrical couplers disposed on a first end of the cylindrical body and disposed in a configuration to mate with electrical couplers in the existing utility power meter;
   a second set of electrical couplers disposed on a second end of the cylindrical body and disposed in a configuration to mate with electrical couplers of an electrical service panel;
   an electrical switch disposed in the cylindrical body; and
   a first electrical socket disposed on the exterior surface of the cylindrical body and comprising a plurality of receptacles, wherein the receptacles are coupled to the first or second set of electrical couplers through the electrical switch, wherein the electrical switch is operable to decouple the receptacles from the first or second set of electrical couplers.

2. The adapter of claim 1, further comprising:
   a back feed connection from an auxiliary or alternative power supply having prongs corresponding to the plurality of receptacles coupled to the first electrical socket.

3. The adapter of claim 1, further comprising:
   a status indicator disposed on the exterior surface of the cylindrical body configured to indicate a back feed status of an auxiliary or alternative power supply coupled to the first electrical socket.

4. The adapter of claim 1, further comprising:
   a wireless network adaptor configured to relay status or control signals.

5. The adapter of claim 1, further comprising:
   a second electrical socket disposed on the exterior surface of the cylindrical body at an angular separation from the first electrical socket and comprising a second plurality of receptacles, wherein the second plurality of receptacles are coupled to the first or second set of electrical couplers.

6. The adapter of claim 5 wherein the second plurality of receptacles are coupled to the first or second set of electrical couplers via the electrical switch, wherein the electrical switch is further operable to decouple the second plurality of receptacles from the first or second set of electrical couplers.

7. The adapter of claim 1 wherein the exterior surface of the cylindrical body is rotatably coupled to the first and second set of electrical couplers, wherein the first electrical socket can be angularly rotated relative to the first and second set of electrical couplers.

8. The adapter of claim 7 wherein the cylindrical body comprises an internal body and an external body, wherein the internal body is disposed inside and having a common axis with the external body, wherein the external body is electrically and rotatably coupled to the internal body.

9. The adapter of claim 8 wherein the external body comprises a plurality of conductors, and wherein the internal body comprises a plurality of slots configured to accept the plurality of conductors from the external body.

10. A method for installing a supply side back feed in a preexisting electrical service panel comprising:
    inserting an adapter between an electrical utility power meter and service distribution panel, the adapter comprising:
    a cylindrical body having an interior surface and an exterior surface and dimensioned to couple to an existing utility power meter;
    a first set of electrical couplers disposed on a first end of the cylindrical body and disposed in a configuration to mate with electrical couplers in the existing utility power meter;
    a second set of electrical couplers disposed on a second end of the cylindrical body and disposed in a configuration to mate with electrical couplers of an electrical service panel;
    an electrical switch disposed in the cylindrical body; and
    an electrical socket disposed on the exterior surface of the cylindrical body and comprising a plurality of receptacles, wherein the receptacles are coupled to the first or second set of electrical couplers through the electrical switch, wherein the electrical switch is operable to decouple the receptacles from the first or second set of electrical couplers.

11. The method of claim 10, further comprising:
    rotating the electrical socket relative to the first and second set of electrical couplers to position the first electrical socket relative to a back feed connection from an auxiliary or alternative power supply.

12. A method of claim 11 further comprising:
    inserting prongs from the back feed connection into the receptacles of the first electrical socket.

13. The method of claim 12, further comprising:
    activating the electrical switch to connect the first set of electrical couplers to the second set of electrical couplers.

14. The method of claim 13 wherein activating the switch comprises sending a signal to a wireless network adapter coupled to the switch.

15. The method of claim 13 wherein activating the electrical switch comprises manually operating an activation mechanism disposed on the exterior surface of the cylindrical body and coupled to the switch.

16. The method of claim 13, further comprising visually confirming activation of the switch through a window disposed in the cylindrical body.

17. A method for servicing an auxiliary or alternative power supply system comprising a cylindrical body having an interior surface and an exterior surface and dimensioned to couple to an existing utility power meter, a window disposed in the cylindrical body, a first set of electrical couplers disposed on a first end of the cylindrical body and disposed in a configuration to mate with electrical couplers in the existing utility power meter, a second set of electrical couplers disposed on a second end of the cylindrical body and disposed in a configuration to mate with electrical couplers of an electrical service panel, and an electrical socket disposed on the exterior surface of the cylindrical body and comprising a plurality of receptacles, wherein the receptacles are coupled to the first or second set of electrical couplers via an electrical switch, the method comprising
    deactivating the electrical switch;
    visually confirming deactivation of the electrical switch through the window disposed in the cylindrical body.

18. The method of claim 17 wherein the auxiliary or alternative power supply system further comprises a deactivation control disposed on the cylindrical body and coupled to the electrical switch, and wherein deactivating the electrical switch comprises manually operating the deactivation control.

19. The method of claim 17 wherein deactivating the electrical switch comprises sending a deactivation control signal to the electrical switch via a wireless network connection.

* * * * *